United States Patent
Dengler et al.

(10) Patent No.: US 9,921,268 B2
(45) Date of Patent: Mar. 20, 2018

(54) AUTO-ALIGNMENT OF BACKER PLATE FOR DIRECT DOCKING TEST BOARDS

(71) Applicant: INTERNATIONAL BUSINESS MACHINES CORPORATION, Armonk, NY (US)

(72) Inventors: Eberhard Dengler, Boeblingen (DE); Gabriele Kuczera, Boeblingen (DE); Eckhard Kunigkeit, Stuttgart (DE); Siegfried Tomaschko, Boeblingen (DE); Quintino Lorenzo Trianni, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 148 days.

(21) Appl. No.: 14/945,011

(22) Filed: Nov. 18, 2015

(65) Prior Publication Data
US 2017/0139003 A1    May 18, 2017

(51) Int. Cl.
*G01R 31/28* (2006.01)
*G01R 1/067* (2006.01)

(52) U.S. Cl.
CPC ..... *G01R 31/2891* (2013.01); *G01R 1/06794* (2013.01); *G01R 31/2887* (2013.01)

(58) Field of Classification Search
None
See application file for complete search history.

(56) References Cited

U.S. PATENT DOCUMENTS

| | | | |
|---|---|---|---|
| 6,468,816 B2 * | 10/2002 | Hunter | G03F 7/707 324/750.14 |
| 7,348,788 B2 | 3/2008 | Yakabe et al. | |
| 8,810,270 B2 | 8/2014 | Yang | |
| 2003/0080763 A1 | 5/2003 | Yu et al. | |
| 2007/0126440 A1 | 6/2007 | Hobbs et al. | |

(Continued)

FOREIGN PATENT DOCUMENTS

| | | |
|---|---|---|
| JP | 2010008206 A | 1/2010 |
| JP | 2014238371 A | 12/2014 |
| JP | 2015097292 A | 5/2015 |

OTHER PUBLICATIONS

Machine English Translation of JP 2010-008206.*

(Continued)

*Primary Examiner* — Jermele M Hollington
*Assistant Examiner* — Douglas X Rodriguez
(74) *Attorney, Agent, or Firm* — Margaret McNamara; Matthew M. Hulihan; Heslin Rothenberg Farley & Mesiti P.C.

(57) ABSTRACT

A test probe aligner for aligning a test probe card with devices under test of a wafer is provided. The test probe aligner includes a backer plate arranged with its bottom side to the test probe card, and a stiffener mounted to the test probe card outside a horizontal dimension of the backer plate. The stiffener and a top side of the backer plate end in a same plane above the test probe card. The alignment further includes a bridge beam locked to a top side of the stiffener. Furthermore, the test probe aligner also includes at least two actuators and at least two corresponding force measurement sensors below a top surface of the bridge beam, arranged such that forces are applicable to the test probe card.

20 Claims, 4 Drawing Sheets

(56) References Cited

U.S. PATENT DOCUMENTS

| | | | |
|---|---|---|---|
| 2009/0146675 A1* | 6/2009 | Karklin | G01R 1/07364 |
| | | | 324/762.01 |
| 2010/0045322 A1 | 2/2010 | Di Stefano et al. | |
| 2011/0234251 A1 | 9/2011 | Komatsu et al. | |
| 2013/0027051 A1 | 1/2013 | Ouyang et al. | |
| 2013/0106455 A1 | 5/2013 | Edwards et al. | |
| 2016/0069951 A1* | 3/2016 | Yamada | G01R 31/2891 |
| | | | 324/750.2 |
| 2016/0131700 A1* | 5/2016 | Kang | G01R 31/2891 |
| | | | 324/750.01 |
| 2016/0276849 A1 | 9/2016 | Hamada | |

OTHER PUBLICATIONS

Hwa, Lim Kok et al., "Wafer Level Testing Challenges for Flip Chip and Wafer Level Packages," International Wafer Level Packaging Conference Proceedings, Nov. 2012, pp. 1-6.

International Search Report for GB1405316.9 dated Sep. 29, 2014, pp. 1-3.

List of IBM Patents or Patent Applications Treated as Related, Feb. 21, 2017, pp. 1-2.

* cited by examiner

AUTO-ALIGNMENT OF BACKER PLATE FOR DIRECT DOCKING TEST BOARDS

BACKGROUND

One or more aspects of the invention relate generally to aligning a test probe card with devices under test.

Today, integrated circuits (ICs) are typically manufactured many at a time in the form of dies on or in a semiconductor material wafer. Often the manufacturing of the semiconductor wafer is diced, so as to obtain a plurality of IC chips. Before being packaged and shipped to a customer, and before being installed in various electronic systems, the ICs are tested for assessing their functionality, and in particular for ensuring that they are not defective. Typically, the dies are tested before the semiconductor wafer is diced into the individual chips.

Today's state-of-the-art test systems provide a planar wafer chuck and a test probe head as precisely as possible aligned in parallel to the wafer chuck. The test probe head is equipped with hundreds of thousands of pins in order to establish a contact to a device of a wafer to be tested. However, recent technology steps require tighter tolerances and are leading to more precise alignment requirements. Often, manual alignment steps are required in order to establish all electrical contacts between a test probe head and the device under test. For the test procedure, it is mandatory that all electrical contacts are established. One way to ensure a good contact may be to apply a defined force between a test pin and a test pad of the device under test. For short periods of time an electrical current of several amperes may flow through the pin/pad connection several times. The mentioned manual steps may be time-consuming and require special expertise of personnel.

SUMMARY

According to one aspect of the present invention, a method for aligning a test probe card with devices under test may be provided. The method may comprise arranging a backer plate with its bottom side to the test probe card, mounting a stiffener to the test probe card outside a horizontal dimension of the backer plate, wherein the stiffener and a top side of the backer plate end in a same plane above the test probe card, and locking to a top side of the stiffener a bridge beam above the stiffener. Additionally, the method comprises positioning at least two actuators and at least two corresponding force measurement sensors below a top surface of the bridge beam such that forces are applicable to the test probe card.

According to another aspect of the present invention, a test probe aligner for aligning a test probe card with devices under test may be provided. The test probe aligner may comprise a backer plate arranged with its bottom side to the test probe card, and a stiffener mounted to the test probe card outside a horizontal dimension of the backer plate. The stiffener and a top side of the backer plate may end in a same plane above the test probe card. A bridge beam may be locked to a top side of the stiffener, and at least two actuators and at least two corresponding force measurement sensors below a top surface of the bridge beam may be arranged such that forces are applicable to the test probe card.

It may be noted that the proposed alignment addresses, in one example, an alignment in a z-direction, i.e., vertical to a wafer or device under test of a wafer.

Furthermore, embodiments may take the form of a related computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

BRIEF DESCRIPTION OF THE DRAWINGS

The aspects defined above and further aspects of the present invention are apparent from the examples of embodiments to be described hereinafter and are explained with reference to the examples of embodiments, but to which aspects of the invention are not limited.

Embodiments of the invention will be described, by way of example only, and with reference to the following drawings.

DETAILED DESCRIPTION

Figure 1:
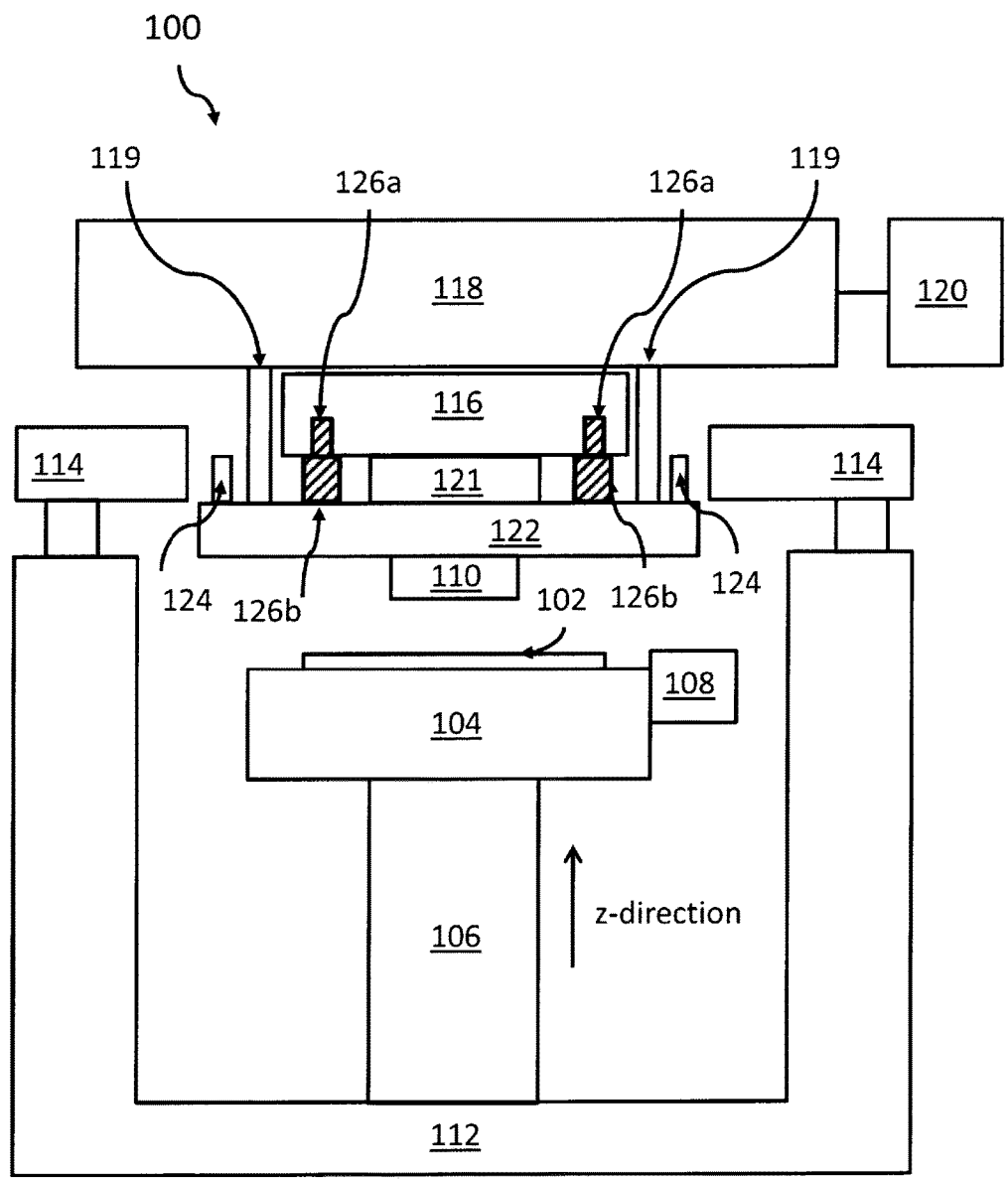
FIG. 1 shows a block diagram of an embodiment of a test probe aligner for aligning a test probe card with devices under test, in accordance with an aspect of the present invention.

In the context of this description, the following conventions, terms and/or expressions may be used:

The term 'test probe aligner' may denote a system comprising elements for an alignment apparatus to align pins of a test probe card of a chip tester with contact pads of a device to be tested, in accordance with an aspect of the present invention.

The term 'test probe card' may denote an electronic circuit board comprising electric and electronic elements which are connected to an advanced testing system. The test probe card may as well be the carrier for pins that may contact the contact pads on the device under test. The test probe card may be part of the test head.

The term 'devices under test' may denote a semiconductor chip, in particular a VLSI (very large scale integration) chip with hundreds or thousands—sometimes even more than 10,000 contact pads—contact points that need to be contacted by pins of the probe card of the test head. During the test the device may be run through a complex test procedure including high current peak tests in which a good contact between the pins of the test probe card and contact pads of the device under test may be required.

The term 'backer plate' may denote a mechanical plate with horizontal dimensions larger than the pin field but smaller than the test probe card. As an example: if the pin field may be 25×25 mm then the backer plate may be larger, e.g., 30×30 mm. Also rectangular or trigonal dimensions are possible, and this example should only be understood as one of many possible sizes. On the other side, the backer plate may lay in a sub-frame of the stiffener and "backing" the test probe card and filling the mechanical gap between the top of the test probe card and the bottom side of the bridge beam.

Thus, the backer plate may have substantially the same height as the stiffener in a z-direction.

The term 'stiffener' may denote a material, e.g., metal, stiffer than the material of the test probe card, e.g., epoxy. The stiffener may have a form of a frame on top of the test probe card or a frame with one or more sash bars or sub-frames. The object of the stiffener is to make the test probe card more rigid and act as a mechanical stabilizer in case a force is applied to an area of the test probe card such that the test probe card does not twist itself. Sometimes the stiffeners are also called distance holders which bridge the distance between the test probe card and the test head without being in contact with a bridge beam (compare FIG. 1).

The term 'bridge beam' may denote a rigid plate fixed to the test head end. The bridge beam may be positioned on top of the stiffener bridging sub-frames of the stiffener. However, the bridge beam does not have to be as large as the complete stiffener frame.

The term 'actuators' may denote a type of motor that may be responsible for moving or controlling a mechanism or system. It may be operated by an energy source, typically electric current or hydraulic fluid pressure, and may convert that energy into motion or an application of a force. An actuator may be the mechanism by which a control system acts upon an environment. The control system may be, e.g., software-based or based on a dedicated hardware controller.

The term 'force measurement sensor' may denote typically an electronic element allowing a measurement of a pressure or elongation by which an applied force may be concluded. The force measurement sensor may be positioned in proximity or in a predefined environment of an actuator such that it may be determined how much force an actuator may apply to the environment.

A method for aligning a test probe card with devices under test, in accordance with an aspect of the present invention, may offer the following:

Due to the fact that several thousands of pins of a test head are to be brought in touch with, e.g., a device under test, the force per pin—which currently corresponds to 20 g per pin—and the precision—would be a value below 25 µm—a very fine adjustment of the test probe card and the wafer is to be provided. However, tolerances of the test probe card are the biggest of the involved mechanical elements and they are bigger than, e.g., 25 µm.

Nowadays, a manual alignment procedure may be required from wafer to wafer (but at least from test probe card to test probe card) which may be very time consuming, error prone, and may require special skills.

In accordance with one or more aspects, a method and auto-aligner, i.e., the test probe aligner, may automate the alignment process and may even adjust itself during a test of many devices under test of a complete wafer. The system may correct itself on a permanent basis. Thus, with the integration of the test probe aligner into the test head, a powerful but still flexible solution may be provided under a cost aspect as well as under feasibility aspects. If the test head was fixed and the wafer may be moved or tilted in order to get a good alignment between the pins, i.e., the test probe card and the device contact pads, the chuck on which the wafer may be mounted may have to be detached from the underlying chuck transport unit which in turn may decrease the ability to lead away the heat the device under test may produce. It may be noted that partially several amperes may flow through areas of the device of a couple of milliseconds such that dozens of Watts of thermal energy is to be carried away. A mechanical gap between the chuck and the chuck transport unit or a split chuck may be a clear disadvantage of such technologies. Additionally, translation forces in the x-y-plane may be present in the case the chuck may be moved which may lead to new misalignment. Having all movable, bendable, twistable components of the test system in one place—the test head—has advantages and the deformation or non-alignment may be cured right at the source of the problem.

Using the device, i.e., the test probe aligner of an aspect of the present invention, it may be possible to bend and twist the test probe card in order to compensate thickness tolerances of the test probe card. In case the chuck would be mounted in a tilt-able way, the chuck surface would have to stay flat and rigid because the wafer may not be bent. A complete aligned contact field may not be achieved in the traditional way without having additional manual mechanical steps involved in the alignment process.

In the following, a detailed description of the figures will be given. All instructions in the figures are schematic. First, a block diagram of an embodiment of the test probe aligner for aligning a test probe card with devices under test is given. Afterwards, further embodiments as well as embodiments of the method for aligning a test probe card with devices under test will be described.

FIG. 1 shows a block diagram of a cross-sectional view of an embodiment 100 of the environment embedding a test probe aligner of an aspect of the present invention for aligning a test probe card with devices under test. A wafer 102—shown in a cross-sectional view as rectangle—is positioned on a prober stage 104 (sometimes also called a chuck) which is positioned on a vertical displacement unit 106. The vertical displacement unit 106 may cause a movement of the prober stage 104 vertically up and down (z-direction). An attached camera system 108 may be used to align a field of pins 110 or contacts with contact pads of a device under test (not shown) of the wafer 102. The camera system 108 may be used to align the pins 110 and the surface of the device under test according to an x-y-plane mathematically normal to the z-direction (see above). The prober stage 104, the vertical displacement unit 106 and the camera system 108 together with the wafer 102 are positioned within a prober 112. On top of the prober 112 a top plate 114 may be positioned. Through this top plate 114 the test probe card 122 including a bridge beam 116 may be inserted. The test probe card 122 may be attached to the test head 118 via joins 119 through which also electric cable from the test probe card 122 may be routed which may be electronically connected to further test and measurement equipment 120.

The bridge beam 116 may be part of the test probe aligner 200 (FIG. 2) for aligning a test probe card 122 and its pins 110 with devices under test of a wafer 102. The test probe aligner 200 comprises a backer plate 121 arranged with its bottom side to the test probe card 122. A stiffener 124 is mounted to the test probe card 122 outside a horizontal dimension of the backer plate 121, wherein the stiffener and a top side of the backer plate 121 ends in a same plane above the test probe card 122. The bridge beam 116 may be locked with locks 126a, 126b to a top side of the stiffener 124. The lower part 126b of the locks may be integrated into the stiffener 124. The stiffener 124 itself may be implemented, e.g., as a frame—potentially with a plurality of sub-frames—on top of the test probe card 122. The upper part 126a of the locks may be integrated into the bridge beam 116.

It may also be noted that the field of pins 110 may be small in comparison to the wafer 102, as shown in FIG. 1.

Figure 2:
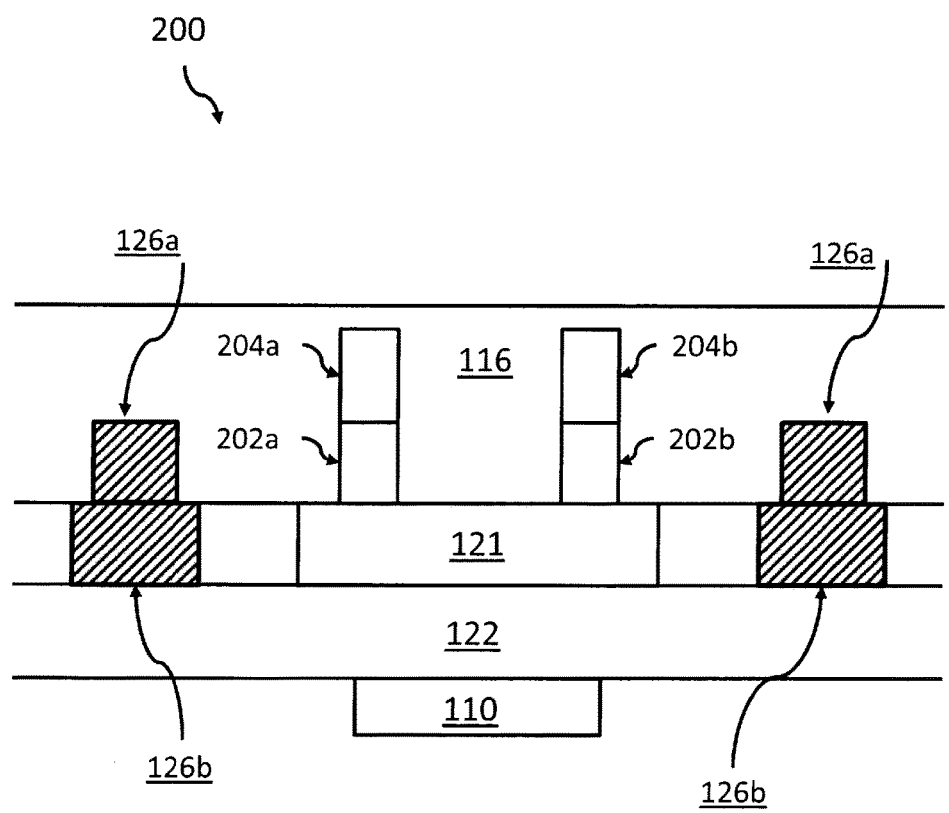
FIG. 2 shows one example of a block diagram of a detailed view of FIG. 1, in accordance with an aspect of the present invention.

FIG. 2 shows a block diagram of a detailed view of FIG. 1, in particular the test probe aligner 200. Again, the following components are recognizable: the bridge beam 116, the locks 126a, 126b, the backer plate 121, the test probe card 122 and the field (2-dimensional) of pins 110. Additionally, at least two actuators 202a, 202b and at least two corresponding force measurement sensors 204a, 204b are positioned below a top surface of the bridge beam 116. They are arranged such that forces are applicable to the test probe card 122. Because the backer plate 121 is not fixed unmovably between the bridge beam 116 and the test probe card 122, forces applied in a vertical direction by the actuators 202a, 202b would be transmitted via the backer plate 121 to the test probe card 122 and thus also to the field of pins 110.

For proper test results of a device under test of the wafer 102 it may be, in one embodiment, required that the top of the pins 110 be aligned with a tolerance below a predefined value. Today's manufacturing methods may require, e.g., a tolerance below 25 µm. However, manufacturing tolerances of, e.g., the test probe card 122 may be higher than this allowed tolerance. Thus, it may not be guaranteed that all pins 110 of the pin field attached to the test probe card 122 end within the mentioned tolerance in order to establish a contact between all pins 110 and contact pads on the device under test. By applying a force at different positions of the backer plate 121 by the actuators 202a or 202b, it may be possible to bend or twist the test probe card 122 via the backer plate 121 in a way that the defined tolerance are met.

As can be seen, the actuators 202a, 202b as well as the force measurement sensors 204a, 204b are arranged inside the bridge beam 116 which may be manufactured in an un-bendable way if compared to the flexibility of the test probe card 122. It may also be recognized that one actuator 202a corresponds to a force measurement sensor 204a, whereas another actuator 202b corresponds to another force measurement sensor 204b. However, a skilled person would also recognize that at least two actuators 202a, 202b may be sufficient to apply variable forces to the test probe card 122. In order for a more fine-grained force application to the test probe card 122 via the backer plate 121 the third or fourth or even more couples of actuators 202 and force measurement sensors 204 may be used. It may also be noted that an actuator 202 and a force measurement sensor 204 may not be arranged directly on top of each other. However, they may be arranged in a way that a force applied by one of the actuators 202 may be related to one of the force measurement sensors 204. The actuators may, e.g., be arranged in a triangle form within the bridge beam 116, in case three actuators 202 are available. In case four actuators 202 are present, they may be arranged at corner points of a square or a rectangular shape which may be aligned with the field of pins 110. It may also be recognized that the backer plate 121 is smaller than the test probe card 122 or a sub-frame of it and bigger than the field of pins 110. It may also be noted that the backer plate 121 is positioned between the locks 126a and 126b. Of course, more than two actuators with corresponding force measurement sensors may be used as part of the test probe aligner.

Again, for completeness reasons, the individual features of the test probe aligner 200 may be mentioned:

According to one embodiment of the test probe aligner, the at least two actuators 202a, 202b and the at least two corresponding force measurement sensors 204a, 204b are positioned inside the bridge beam 116. More pairs of two actuators 202a, 202b corresponding to force measurement sensors 204a, 204b, may be applicable.

According to another embodiment of the test probe aligner, a lower side of the at least two actuators 202a, 202b may align with a lower side of the bridge beam 122, in such a way that forces may be applied to the backer plate 121. The rigid backer plate 121 itself may transfer the force or forces to the test probe card 122.

According to one embodiment of the test probe aligner, the at least two actuators 202a, 202b—or more—and the at least two corresponding force measurement sensors 204a, 204b, may—alternatively to a positioning inside the bridge beam 116—be positioned inside the backer plate 121. Also in this case, a force may be applied to the test probe card 122. A comparable effect, as described above, may be achieved in terms of an alignment of the pins 110 to the test pads of the device under test of the wafer 120.

According to one embodiment of the test probe aligner, one of the at least two actuators 202a, 202b and a corresponding one of the at least two corresponding force measurement sensors 204a, 204b, may be positioned within a predefined environment of each other. This may mean relatively close to each other but not necessarily as a sandwich construct. In one embodiment, a force, measured by one of the force measurement sensors 204a, 204b, may be related to one of the actuators 202a, 202b.

According to one embodiment of the test probe aligner, the wafer 120 may be fixed to a chuck which may be movable vertically—here the z-direction—to a plane defined by the test probe card 122, here the x-y plane. A horizontal movement of the test head 118 (FIG. 1) and devices attached to it may enable a testing of another device under test of the wafer 120 without any realignment of the test probe card 122.

According to an embodiment of the test probe aligner, the forces, applicable to the backer plate 121, may have the same vector direction as a chuck move direction, in particular the z-direction.

According to an additional embodiment of the test probe aligner, the actuators may be piezo actuators 202a, 202b. This way energy may be transported to the actuator 202a, 202b in an easy way by cables.

According to an embodiment of the test probe aligner, the actuators may also be hydraulic based. One may notice such an arrangement may be applicable if the actuators 202a, 202b may be positioned within the bridge beam 116.

According to one additional embodiment of the test probe aligner, the backer plate 121 may extend over edges of the devices under test, i.e., the backer plate 121 may be bigger in horizontal directions than the field of pins 110 to contact the device under test of the wafer 120.

Figure 3:
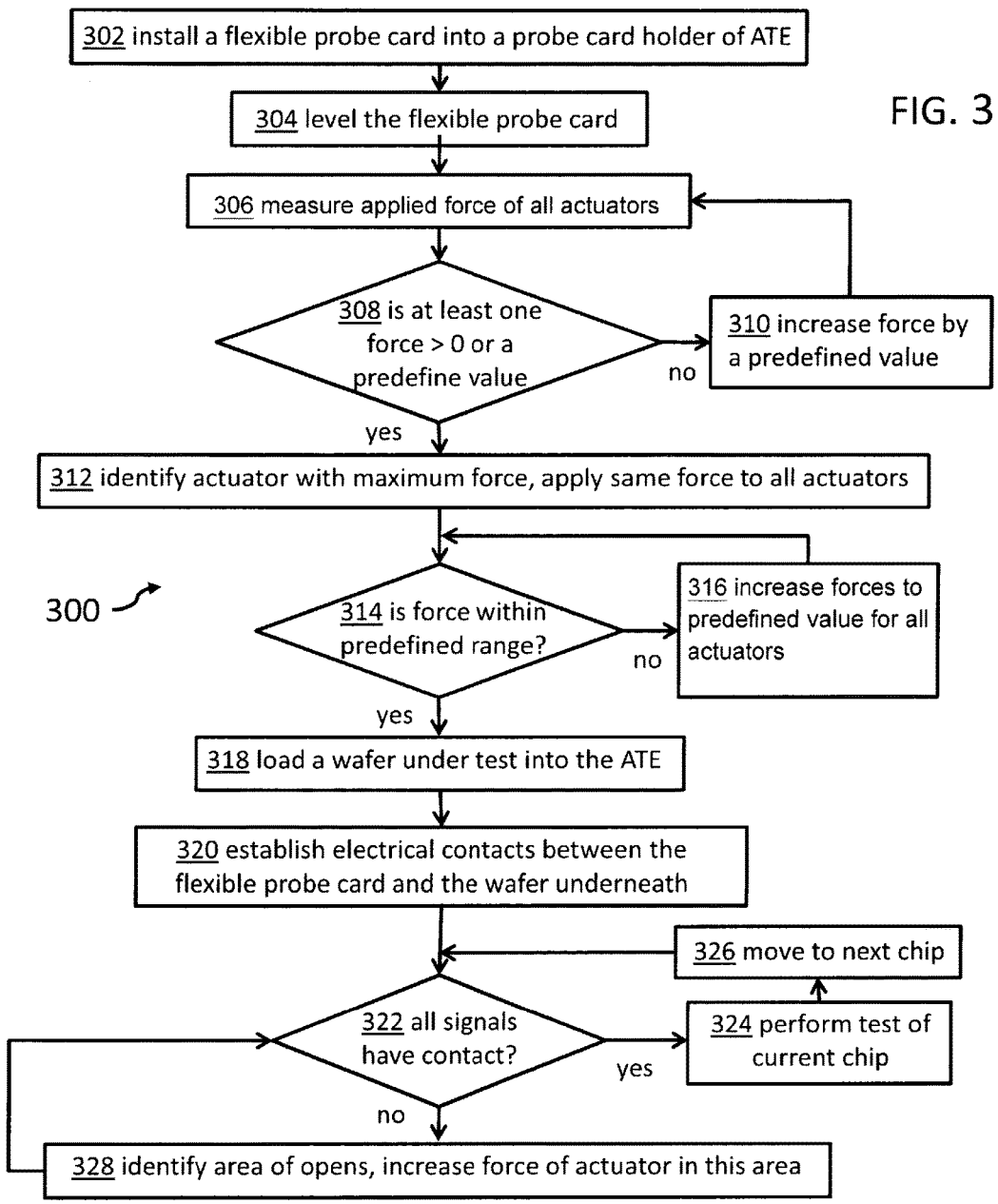
FIG. 3 shows a block diagram of an embodiment of a method for aligning a test probe card with devices under test, in accordance with an aspect of the present invention.

FIG. 3 shows a block diagram of an embodiment of a method 300 for aligning a test probe card 122 with devices under test, in accordance with an aspect of the present invention. First, 302, a flexible test probe card 122 may be installed into a test probe card holder of advanced test equipment (ATE). The test probe card 122 may be leveled, 304, or pre-aligned using the camera system 108. The applied force of the actuators 202a, 202b may be measured, 306. It may be determined, 308, whether at least one measured force, measured by the force measurement sensors 204a, 204b, is above zero or a predefined threshold value. In case of "no", the applied force may be increased, 310, by a predefined value by one or more of the actuators 202a, 202b. In case of "yes", the threshold value for the measured force is reached or exceeded, and the actuator 202a, 202b applying the highest or maximum force value may be identified and the same force may be applied by or in actuators 202a, 202b (compare 312).

Next, it may be determined, 314 whether the now applied force is within a predefined range. In case of "no", the forces may be increased, 316, to a predefined value for all actuators 202a, 202b. This may be required for aligning all pin ends of the field of pins 110, attached to the test probe card 122, completely horizontal within the predefined tolerance mathematically normal to the z-axis, at least with a delta value below the tolerance. Thus, it may guarantee that a predefined force value or contact force between each pin 120 and a related contact pad of the device under test may be achieved.

Now, a wafer 120 under test may be loaded, 318, into the advanced test equipment. Then, electrical contacts may be established, 320, between the pins 110 of the flexible test probe card 122 and the wafer 120 underneath by moving the vertical displacement unit 106. Then it may be determined, 322, whether all contacts are established, i.e., that all signals have contact. In case of "yes", a test of the current device or chip in the test is performed, 324. Then, the chuck with the wafer 120 is moved, 326, such that the next device on the wafer 120 is below the pin field 121 (alternatively, the test head may be moved). In case of "no", areas of open contacts are identified, 328, and a force, generated by one of the actuators 202a, 202b may be increased in an area above the not established contacts. Then it may again be determined, 322, if all signals go through to the contact pads of the device under test. Using this method, in one example, 100% of the contacts between the pins 110 of the test probe card 122 and the test pads of the device on the test of the wafer 120 may be established. No additional adjustment, in particular manual adjustment of the wafer, may be required. A once found alignment of the test probe card 122 and thus of the pins 110 may be used for several wafers 120 in a test sequence without any alignment steps between measurement of devices of different wafers 120.

Again, for completeness reasons, the individual features of the method may be mentioned:

According to one embodiment of the method 300, the method 300 may also comprise measuring of a force applied by each one of the actuators 202a, 202b using the corresponding force measurement sensors 204a, 204b. This may allow determining not only a total force applied to the probe card but also those forces that are applied individually, sensor by sensor.

According to one embodiment of the method 300, the method may also comprise identifying an actuator 202a, 202b applying a maximum force of all available actuators 202a, 202b and applying a same force by all actuators 202a, 202b, wherein the same force is above a predefined threshold force value. This way, a level setting or initialization of the system may be achieved.

According to one additional embodiment of the method 300, also pre-aligning a wafer under test with pins 110 of the test probe card may be comprised as well as providing electrical contacts between test probe card pins 110 and the device under test. The pre-alignment may be performed using optical methods using the camera system 120. The pre-alignment may also comprise a rotational alignment between the test probe card and the device to be tested.

One embodiment of the method 300 may comprise determining whether all of the test probe card pins provide an electrical contact to the device under test. This is for performing successful and complete test procedures.

According to one embodiment of the method 300, the method may also comprise that, if the determination confirms that not all of the test probe card pins have each an electrical contact to the device under test, increasing a force on the test probe card using one of the actuators corresponding to a region above an area of the test probe card in which an electrical contact is not established. This part may represent the auto-alignment part of the method. It may be performed on a regular basis such that also variable environmental conditions (like, e.g., varying air pressure) may be compensated.

Figure 4:
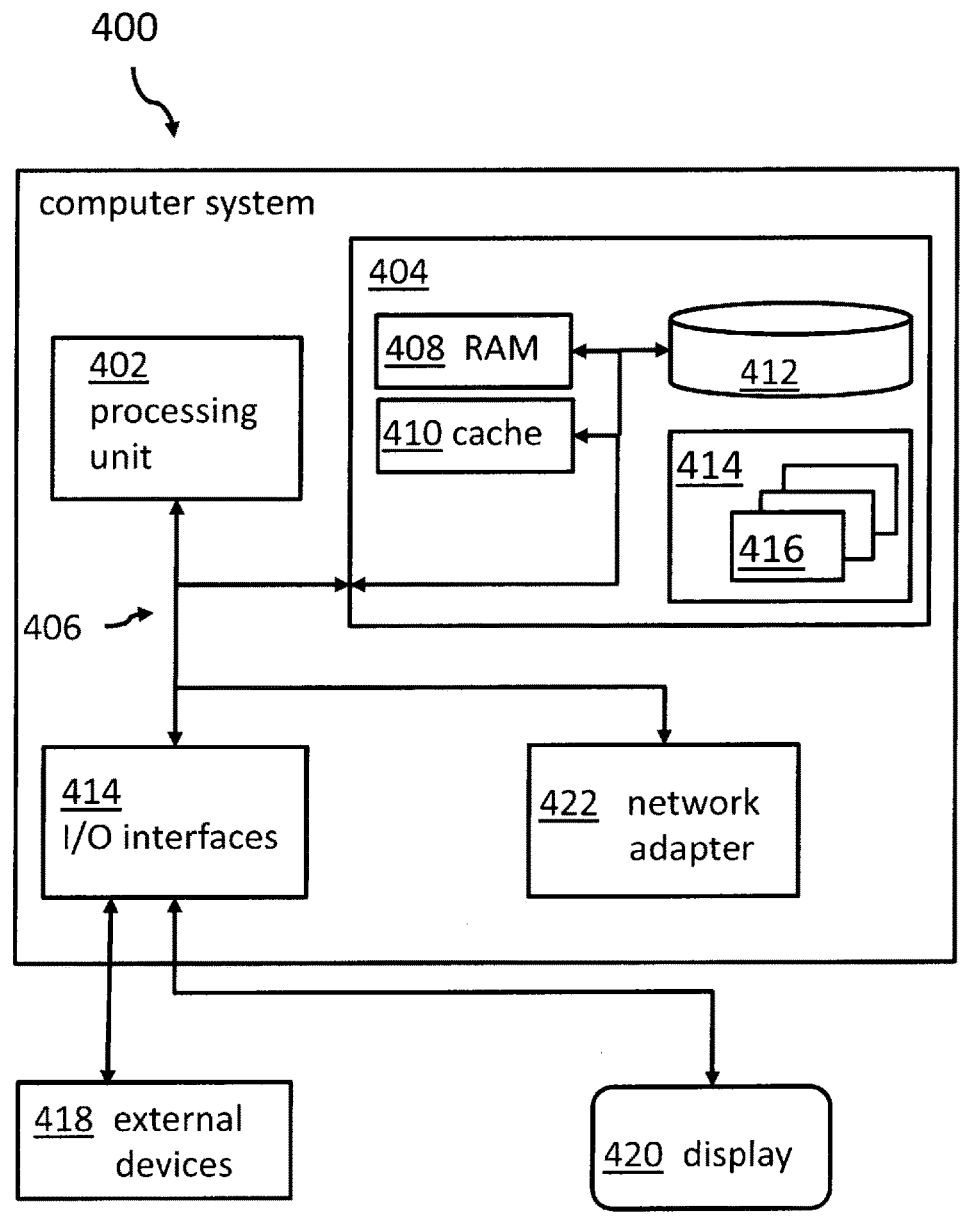
FIG. 4 shows an embodiment of a computer system used for executing the method or parts thereof, in accordance with an aspect of the present invention.

Embodiments of the method may be implemented together with virtually any type of computer, regardless of the platform being suitable for storing and/or executing program code. FIG. 4 shows, as an example, a computing system 400 suitable for executing program code related to the proposed method or parts thereof.

The computing system 400 is only one example of a suitable computer system and is not intended to suggest any limitation as to the scope of use or functionality of embodiments of the invention described herein. Regardless, computer system 400 is capable of being implemented and/or performing any of the functionality set forth hereinabove. In the computer system 400, there are components, which are operational with numerous other general purpose or special purpose computing system environments or configurations. Examples of well-known computing systems, environments, and/or configurations that may be suitable for use with computer system/server 400 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 400 may be described in the general context of computer system-executable instructions, such as program modules, being executed by a computer system 400. Generally, program modules may include routines, programs, objects, components, logic, data structures, and so on that perform particular tasks or implement particular abstract data types. Computer system/server 400 may be practiced in distributed cloud computing environments where tasks are performed by remote processing devices that are linked through a communications network. In a distributed cloud computing environment, program modules may be located in both local and remote computer system storage media including memory storage devices.

As shown in the figure, computer system/server 400 is shown in the form of a general-purpose computing device. The components of computer system/server 400 may include, but are not limited to, one or more processors or processing units 402, a system memory 404, and a bus 406 that couples various system components including system memory 404 to the processor 402. Bus 406 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 400 typically includes a variety of computer system readable media. Such media may be any available media that is accessible by computer system/server 400, and it includes both, volatile and non-volatile media, removable and non-removable media.

The system memory 404 may include computer system readable media in the form of volatile memory, such as random access memory (RAM) 408 and/or cache memory 410. Computer system/server 400 may further include other removable/non-removable, volatile/non-volatile computer system storage media. By way of example only, storage system 412 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 406 by one or more data media interfaces. As will be further depicted and described below, memory 404 may include at least one program product having a set (e.g., at least one) of program modules that are configured to carry out the functions of embodiments of the invention.

Program/utility 414, having a set (at least one) of program modules 416, may be stored in memory 404 by way of example, and not limitation, as well as an operating system, one or more application programs, other program modules, and program data. Each of the operating system, one or more application programs, other program modules, and program data or some combination thereof, may include an implementation of a networking environment. Program modules 416 generally carry out the functions and/or methodologies of embodiments of the invention as described herein.

The computer system/server 400 may also communicate with one or more external devices 418 such as a keyboard, a pointing device, a display 420, etc.; one or more devices that enable a user to interact with computer system/server 400; and/or any devices (e.g., network card, modem, etc.) that enable computer system/server 400 to communicate with one or more other computing devices. Such communication can occur via Input/Output (I/O) interfaces 414. Still yet, computer system/server 400 may communicate with one or more networks such as a local area network (LAN), a general wide area network (WAN), and/or a public network (e.g., the Internet) via network adapter 422. As depicted, network adapter 422 may communicate with the other components of computer system/server 400 via bus 406. It should be understood that although not shown, other hardware and/or software components could be used in conjunction with computer system/server 400. Examples, include, but are not limited to: microcode, device drivers, redundant processing units, external disk drive arrays, RAID systems, tape drives, and data archival storage systems, etc.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus, or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should be noted that embodiments of the invention are described with reference to different subject-matters. In particular, some embodiments are described with reference to method type claims whereas other embodiments have been described with reference to apparatus type claims. However, a person skilled in the art will gather from herein that, unless otherwise notified, in addition to any combination of features belonging to one type of subject-matter, also any combination between features relating to different subject-matters, in particular, for instance, between features of the method type claims, and features of the apparatus type claims, is considered as to be disclosed within this document.

The corresponding structures, materials, acts, and equivalents of all means or steps plus function elements in the claims below are intended to include any structure, material, or act for performing the function in combination with other claimed elements, as specifically claimed. The description of aspects of the present invention has been presented for purposes of illustration and description, but is not intended to be exhaustive or limited to the invention in the form disclosed. Many modifications and variations will be apparent to those of ordinary skills in the art without departing from the scope and spirit of aspects of the invention. The embodiments are chosen and described in order to best explain the principles of aspects of the invention and the practical application, and to enable others of ordinary skills in the art to understand aspects of the invention for various embodiments with various modifications, as are suited to the particular use contemplated.

What is claimed is:

1. A method of aligning a test probe card with devices under test of a wafer, said method comprising:
    arranging a backer plate with its bottom side to said test probe card;
    mounting a stiffener to said test probe card outside a horizontal dimension of said backer plate, the stiffener being contained vertically within a perimeter of the test probe card, wherein said stiffener and a top side of said backer plate end in a same plane above said test probe card;
    locking to a top side of said stiffener a bridge beam above said stiffener; and
    positioning at least two actuators and at least two corresponding force measurement sensors below a top surface of said bridge beam such that forces are applicable to said test probe card, the at least two actuators being disposed at least partially in the bridge beam adjacent to the backer plate to engage the backer plate and apply force to the backer plate.

2. The method according to claim 1, further comprising measuring a force applied by each actuator of said at least two actuators using a corresponding force measurement sensor of said at least two corresponding force measurement sensors.

3. The method according to claim 2, further comprising:
    identifying an actuator of the at least two actuators applying a maximum force; and applying a same force by the at least two actuators, wherein said same force is above a predefined threshold force value.

4. The method according to claim 3, further comprising:
pre-aligning a wafer under test with pins of said test probe card; and
providing electrical contacts between the pins of the test probe card and said device under test.

5. The method according to claim 4, further comprising determining whether said pins of said test probe card provide an electrical contact to said device under test.

6. The method according to claim 5, further comprising:
based on said determination confirming that one or more of said pins of said test probe card does not have an electrical contact to said device under test, increasing a force on said test probe card using one actuator of said at least two actuators corresponding to a region above an area of said test probe card in which an electrical contact is not established.

7. The method of claim 1, wherein the backer plate comprises backer plate material in vertical alignment with, and extending over, a pin field of the test probe card to a dimension wider than the pin field.

8. A test probe aligner for aligning a test probe card with devices under test of a wafer, said test probe aligner comprising:
a backer plate arranged with its bottom side to said test probe card;
a stiffener mounted to said test probe card outside a horizontal dimension of said backer plate, the stiffener being contained vertically within a perimeter of the test probe card, wherein said stiffener and a top side of said backer plate end in a same plane above said test probe card;
a bridge beam locked to a top side of said stiffener; and
at least two actuators and at least two corresponding force measurement sensors below a top surface of said bridge beam, arranged such that forces are applicable to said test probe card, the at least two actuators being disposed at least partially in the bridge beam adjacent to the backer plate to engage the backer plate and apply force to the backer plate.

9. The test probe aligner according to claim 8, wherein said at least two actuators and said at least two corresponding force measurement sensors are positioned inside said bridge beam.

10. The test probe aligner according to claim 8, wherein a lower side of said at least two actuators align with a lower side of said bridge beam.

11. The test probe aligner according to claim 8, wherein said at least two actuators and said at least two corresponding force measurement sensors are positioned inside said backer plate.

12. The test probe aligner according to claim 8, wherein one actuator of said at least two actuators and a corresponding one force measurement sensor of said at least two corresponding force measurement sensors are positioned within a predefined environment.

13. The test probe aligner according to claim 8, wherein said wafer is fixed to a chuck which is movable vertically to a plane defined by said test probe card.

14. The test probe aligner according to claim 8, wherein said forces applicable to said test probe card have a same vector direction as a chuck move direction.

15. The test probe aligner according to claim 8, wherein said at least two actuators are piezo actuators.

16. The test probe aligner according to claim 8, wherein said at least two actuators are hydraulic based.

17. The test probe aligner according to claim 8, wherein said backer plate extends over edges of said devices under test.

18. A computer readable storage medium storing instructions for execution for performing a method, the method comprising:
measuring a force applied by each actuator of at least two actuators using a corresponding force measurement sensor of at least two corresponding force measurement sensors, the at least two actuators and the at least two corresponding force measurement sensors being positioned below a top surface of a bridge beam locked to a top side of a stiffener mounted to a test probe card such that forces are applicable to said test probe card, the test probe card to be aligned with devices under test, and wherein a backer plate is arranged with its bottom side to said test probe card and wherein the stiffener is mounted to said test probe card outside a horizontal dimension of said backer plate, the stiffener being contained vertically within a perimeter of the test probe card, wherein said stiffener and a top side of said backer plate end in a same plane above said test probe card, and wherein the at least two actuators are disposed at least partially in the bridge beam adjacent to the backer plate to engage the backer plate and apply force to the backer plate;
pre-aligning a wafer under test with pins of said test probe card;
providing electrical contacts between the pins of the test probe card and said device under test;
determining whether said pins of said test probe card provide an electrical contact to said device under test; and
based on said determination confirming that one or more of said pins of said test probe card does not have an electrical contact to said device under test, increasing a force on said test probe card.

19. The computer program product according to claim 18, wherein the method further comprises:
identifying an actuator of the at least two actuators applying a maximum force; and
applying a same force by the at least two actuators, wherein said same force is above a predefined threshold force value.

20. The computer program product according to claim 19, wherein based on said determination confirming that one or more of said pins of said test probe card does not have an electrical contact to said device under test, increasing the force on said test probe card using one actuator of said at least two actuators corresponding to a region above an area of said test probe card in which an electrical contact is not established.

* * * * *